(12) United States Patent
Kubo et al.

(10) Patent No.: US 6,597,630 B1
(45) Date of Patent: Jul. 22, 2003

(54) SYNCHRONOUS SEMICONDUCTOR MEMORY DEVICE WITH NOEMI OUTPUT BUFFER CIRCUIT

(75) Inventors: Takashi Kubo, Hyogo (JP); Yasuhiro Konishi, Hyogo (JP); Takashi Kono, Hyogo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 10/253,883

(22) Filed: Sep. 25, 2002

(30) Foreign Application Priority Data

Mar. 25, 2002 (JP) ........................ 2002-083335

(51) Int. Cl.[7] .............. G11C 7/00; G11C 8/00
(52) U.S. Cl. .................. 365/233; 365/189.05
(58) Field of Search ............. 365/233, 189.05, 365/194, 226

(56) References Cited

U.S. PATENT DOCUMENTS

| | | | |
|---|---|---|---|
| 4,740,713 A | | 4/1988 | Sakurai et al. |
| 5,384,735 A | * | 1/1995 | Park et al. ............... 365/233 |
| 6,163,491 A | * | 12/2000 | Iwamoto et al. ........ 365/233 |
| 6,166,969 A | * | 12/2000 | Song et al. ............... 365/233 |
| 6,212,126 B1 | * | 4/2001 | Sakamoto ............... 365/233 |
| 6,226,204 B1 | * | 5/2001 | Inuzuka et al. .......... 365/233 |
| 6,337,832 B1 | * | 1/2002 | Ooishi et al. ............ 365/233 |
| 6,373,782 B1 | * | 4/2002 | Ikeda ..................... 365/189.05 |
| 6,452,849 B1 | * | 9/2002 | Iwamoto .................. 365/233 |
| 6,456,563 B1 | * | 9/2002 | Kajimoto ................. 365/233 |
| 6,487,142 B2 | * | 11/2002 | Toda ....................... 365/233 |
| 6,489,819 B1 | * | 12/2002 | Kono et al. .............. 365/233 |
| 6,529,423 B1 | * | 3/2003 | Yoon et al. .............. 365/233 |

FOREIGN PATENT DOCUMENTS

JP 11-328955 11/1999

* cited by examiner

*Primary Examiner*—Trong Phan
(74) *Attorney, Agent, or Firm*—McDermott, Will & Emery

(57) ABSTRACT

There are provided a control signal generation circuit receiving an external instruction input in synchronization with a clock signal to generate a control signal for defining a data output period in response to the external instruction, and an output buffer circuit receiving data read from a memory array for output to an output node for the data output period, and there is further provided an output control circuit for controlling turning first, second and third transistors on and off, the output control circuit in the data out period turning on and off one of the first and second transistors complementarily in response to the read data and also turning on the third transistor in response to the control signal.

5 Claims, 15 Drawing Sheets

SYNCHRONOUS SEMICONDUCTOR MEMORY DEVICE WITH NOEMI OUTPUT BUFFER CIRCUIT

BACKGROUND OF THE INVENTION

1. Field of the Invention

The present invention relates generally to synchronous semiconductor memory devices synchronized with a clock signal and particularly to configurations of output buffer circuits.

2. Description of the Background Art

In microfabrication of a transistor, scaling a device down is not always associated with accordingly scaling a power supply voltage down, and the power supply voltage can be maintained constant while the device's dimension can be reduced. In this case, the transistor provides an intense electric field in a vicinity of the drain. Hot carriers are thus produced in a channel and jump into a gate oxide film to impair the transistor's device characteristics disadvantageously. One approach to solve this problem is "Normally-On Enhancement MOSFET Insertion (NOEMI)."

FIG. 15 shows one example of an NOEMI output buffer circuit internal to an LSI.

With reference to FIG. 15, this NOEMI output buffer circuit operates in response to data signals TO, /OT to transmit data to an output terminal OP connected to an external bus. Data signals OT, /OT are complementary signals corresponding to data output from the LSI externally. Data signal/OT corresponds to an inverted version of data signal OT. Hereinafter similarly the mark "/" used with a signal will indicate an inverted version of the signal. For example, a signal /S is an inverted version of a signal S.

This output buffer circuit is provided with an n channel MOS transistor NT2 connected between an output node NO of an inverter formed by a n channel MOS transistor NT1 and a p channel MOS transistor PT1 and a drain terminal of transistor NT1. Transistor NT2 has its gate constantly receiving a power supply voltage VCC. Transistor NT2 is thus constantly turned on. By the provision of transistor NT2 the transistor NT1 drain voltage is limited to a voltage Vd=Vg−Vth, wherein voltage Vg to a gate voltage of transistor NT2 and voltage Vth corresponds to a threshold voltage Vth of transistor NT2.

The insertion of transistor NT2 can thus limit a drain voltage applied to transistor NT1 and thus prevent the transistor from having poor device characteristics attributed to injection of hot carriers.

FIG. 16 shows a configuration of a non-NOEMI output buffer circuit.

The FIG. 16 circuit is identical in configuration to the FIG. 15 circuit minus transistor NT2. It transmits to node NO the data corresponding to complimentary data signals OT, /OT.

FIG. 17 conceptually represents a region of a capacitance corresponding to a load (hereinafter also referred to as a "load capacitance") of output node NO for the non-NOEMI output buffer circuit of FIG. 16.

With reference to FIG. 17, transistors PT1 and NT1 are shown to form an output buffer circuit formed on a substrate. In a region shown in FIG. 17 in which transistor PT1 is formed the source's side is connected to power supply voltage VCC and the drain's side is connected to node NT0. The gate receives the level in voltage of data signal /OT input. In a region in which transistor NT1 is formed the source's side is connected to a ground voltage GND and the drain's side is connected to node N0. The gate receives the level in voltage of data signal OT input. For this non-NOEMI output buffer circuit, output node NO is associated with a load capacitance corresponding to a region on the side of the drain of transistor PT1 (a drain junction capacitance on the side of transistor PT1) and a region on the side of the drain of transistor NT1 (a drain junction capacitance on the side of transistor NT1). More specifically, as shown in FIG. 17, a hatched region on the side of the drains of transistors PT1 and NT1 corresponds to a region of a load capacitance imposed on output node N0.

FIG. 18 conceptually represents a region of a load capacitance of output node N0 for NOEMI output buffer circuit of FIG. 15 with transistor NT2 constantly turned on.

With reference to FIG. 18, transistors PT1, NT1 and NT2 are shown to form an NOEMI output buffer circuit formed on a substrate. As has been described previously, FIG. 18 is different from FIG. 17 in that transistor NT2 is further provided on a substrate at a predetermined region in which an N-type transistor is formed.

Transistor NT2 is provided between transistor NT1 and node N0 and the transistor NT1 drain's side and the transistor NT2 source's side are electrically coupled together. Transistor NT2 has its gate receiving power supply voltage VCC and the transistor NT2 drain's side is connected to node N0.

Node N0 has a load capacitance imposed thereon, as follows: with its gate constantly receiving power supply voltage VCC, transistor NT2 is constantly turned on and the capacitance of the gate of transistor NT2 and that in a region closer to the drain of transistor NT1 or the source of transistor NT2 (an inter-gate junction capacitance) are added to node N0 in addition to a drain junction capacitance of transistors PT1 and NT2. Thus while the NOEMI output buffer circuit with transistor NT2 constantly turned on can prevent injection of hot carriers it would disadvantageously introduce increased load capacitance.

This increased load capacitance is never negligible for memory systems having a high speed interface such as synchronous dynamic random access memory (SDRAM), double data rate (DDR) SDRAM and the like.

FIG. 19 shows a concept for implementing rapid data transfer in a memory system having a high speed interface. As shown in FIG. 19, LSIs each have output terminal OP electrically connected to an output node of an output buffer circuit and are connected in parallel to an external bus.

FIG. 20 compares data waveforms based on a difference between a load capacitance of output node N0 of a non-NOEMI output buffer circuit and that of the node of an NOEMI output buffer circuit when data is transferred rapidly.

If the LSI is configured with the non-NOEMI output buffer circuit a small load capacitance is imposed on output terminal OP. Thus, as shown in FIG. 20, if data is transferred rapidly, with the small load capacitance imposed on output terminal OP, the data can be transmitted in a short period of time with a desired level. If the LSI has the NOEMI output buffer circuit then a load capacitance larger than for the non-NOEMI output buffer circuit is imposed on output terminal OP. As such, if data is rapidly transferred, with a large load capacitance imposed on output terminal OP, the data is hardly transmitted in a short period of time with a desired level. As a result, data transferred would provide a signal level lower than before the data is rapidly transferred. This can result in a detection portion internal to a system erroneously recognizing the transferred data.

SUMMARY OF THE INVENTION

The present invention contemplates a synchronous semiconductor memory device capable of rapid data transfer, having an NOEMI output buffer circuit with an output terminal free from significant load capacitance.

The present invention in one aspect provides a synchronous semiconductor memory device operating in synchronization with a clock signal, including a memory array, a control signal generation circuit, an output buffer circuit, and an output control circuit. The memory array has a plurality of memory cells arranged in rows and columns and each storing data. The control signal generation circuit receives an external instruction input in synchronization with the clock signal to generate a control signal for defining a data output period in response to the external instruction. The output buffer receives data read from the memory array for output to an output node during the data output period. Furthermore the output buffer circuit includes a first transistor connected between the output node and a first voltage, a second transistor connected between the output node and a second voltage, and a third transistor connected between the output node and the second voltage in series with the second transistor. The output control circuit controls turning on/off the first, second and third transistors and in the data output period complementarily turns on and off one of the first and second transistors in response to the read data and also turns on the third transistor in response to the control signal.

A main disadvantage of the present synchronous semiconductor memory device is that the third transistor can be turned on only for a data output period to reduce a load capacitance imposed on an output node when a data output operation starts. If data is rapidly transferred, a time required to charge/discharge the output node in accordance with data to be transferred can be reduced to sufficiently ensure a level of a signal of data to allow steady data transfer.

The present invention in another aspect provides a synchronous semiconductor memory device operating on one of a first voltage and a second voltage higher than the first voltage in synchronization with a clock signal, including a memory array, a control signal generation circuit, an output buffer circuit, and an output control circuit. The memory array has a plurality of memory cells arranged in rows and columns and each storing data. The control signal generation circuit receives an external instruction input in synchronization with the clock signal to generate a control signal for defining a data output period in response to the external instruction. The output buffer receives data read from the memory array for output to an output node during the data output period. Furthermore the output buffer circuit includes a first transistor connected between the output node and a first power supply node, a second transistor connected between the output node and a second power supply node, and a third transistor connected between the output node and the second power supply node in series with the second transistor. The output control circuit controls turning on/off the first, second and third transistors. When the first power supply node is connected to the second voltage and the second power supply node is also connected to a third voltage lower than the first and second voltages, the output control circuit in the data output period complementarily turns on and off one of the first and second transistors in response to the read data and also turns on the third transistor in response to the control signal. When the first power supply node is connected to the first voltage and the second power supply node is also connected to the third voltage, the output control circuit in the data output period complementarily turns on and off one of the first transistor and one of the second and third transistors in response to the read data.

The present synchronous semiconductor memory device can change a signal input to the gate of the third transistor between its operation on the first voltage and that on the second voltage higher than the first voltage. As such, when the first, low operating voltage is used, without the output node having a high voltage applied thereto, the output buffer circuit can be configured to be of non-NOEMI, and when the second, high operating voltage is used, with the output node having a high voltage applied thereto, the output buffer circuit can be configured to be of NOEMI so as to generalize a design of an output buffer among devices operating on different levels of voltage.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
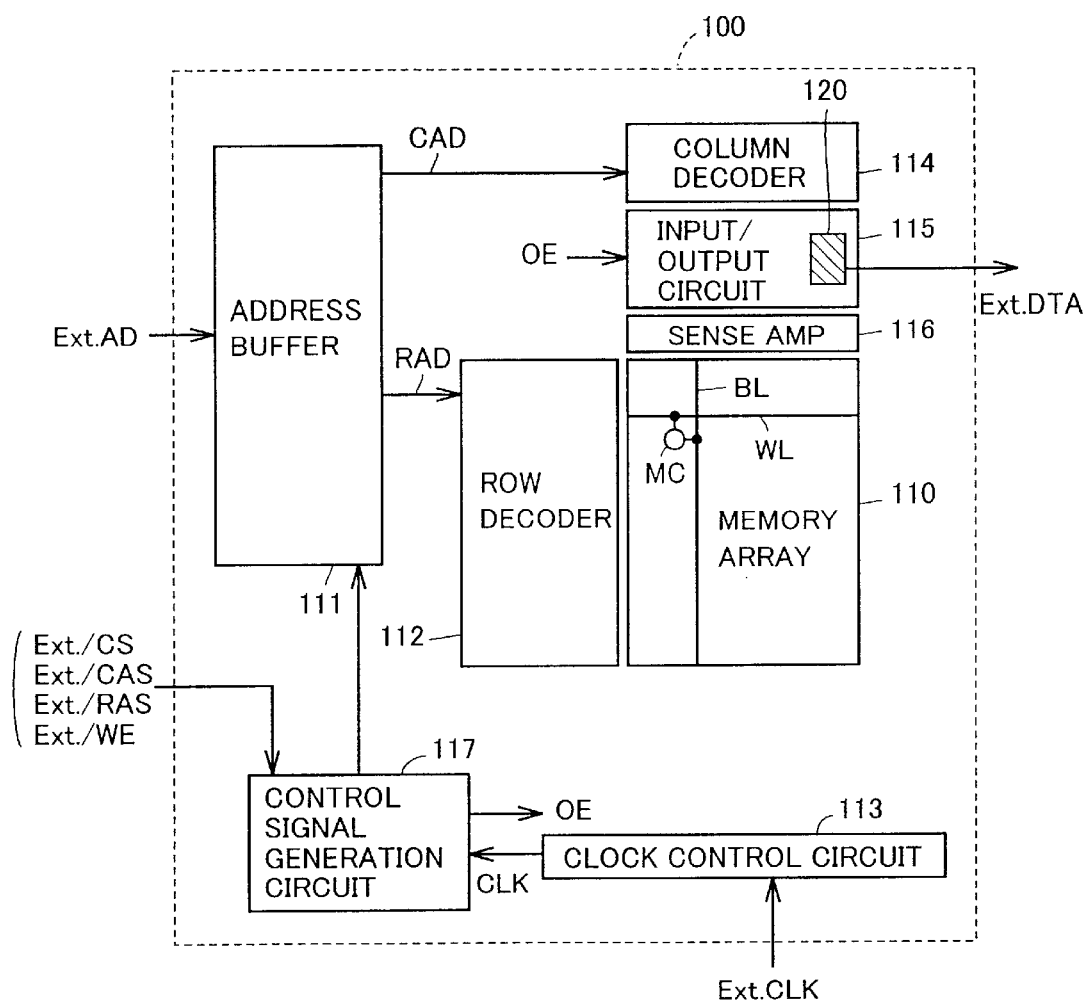
FIG. 1 is a block diagram showing a general configuration of a synchronous semiconductor memory device of the present invention in a first embodiment.

The present invention in embodiments will be described with reference to the drawings in detail. Like components are denoted by like reference characters.

First Embodiment

With reference to FIG. 1, a synchronous semiconductor memory device 100 includes a memory array 110, an address buffer 111, a row decoder 112, a clock control circuit 113, a column decoder 114, an input/output circuit 115, a sense amplifier 116, and a control signal generation circuit 117.

Memory array 110 includes a plurality of memory cells MCs arranged in rows and columns, a plurality of word lines WLs arranged to corresponds to the rows, and a plurality of bit lines BLs arranged to correspond to the columns. FIG. 1 representatively shows a single memory cell and single word and bit lines corresponding thereto.

Address buffer 111 operates in response to a row address strobe signal to provide an external address signal Ext.AD as a row address signal RAD to row decoder 112 and also operates in response to a column address strobe signal to provide external address signal Ext.AD as a column address signal CAD to column decoder 114. Row decoder 112 operates in response to row address signal RAD received from address buffer 111 to select a word line of memory array 110. Column decoder 114 operates in response to column address signal CAD received from address buffer 111 to select a bit line of memory array 110. Sense amplifier 116 amplifies a signal of data read from a memory cell of memory array 110. Input/output circuit 115 controls inputting/outputting data.

Input/output circuit 115 includes an output portion 120 externally outputting as an external data signal Ext.DTA a signal of data read from memory array 110 and amplified by sense amplifier 116. Clock control circuit 113 generates an internal clock signal CLK synchronized with an external clock signal Ext.CLK and having a determined phase difference from external clock signal Ext.CLK (hereinafter, internal clock signal CLK will also simply be referred to as a clock signal CLK). Each internal circuit operates in synchronization with internal clock signal CLK.

Control signal generation circuit 117 receives an external control signal and clock signal CLK to generate an internal control signal for an internal circuit to operate. In the present embodiment, control signal generation circuit 117 generates an output enable signal OE serving as a control signal for defining a data output period. Note that as external control signals are indicated an external chip select signal Ext./CS, an external column address strobe signal Ext./CAS, an external row address strobe signal Ext./RAS, and an external write enable signal Ext./WE.

Figure 2:
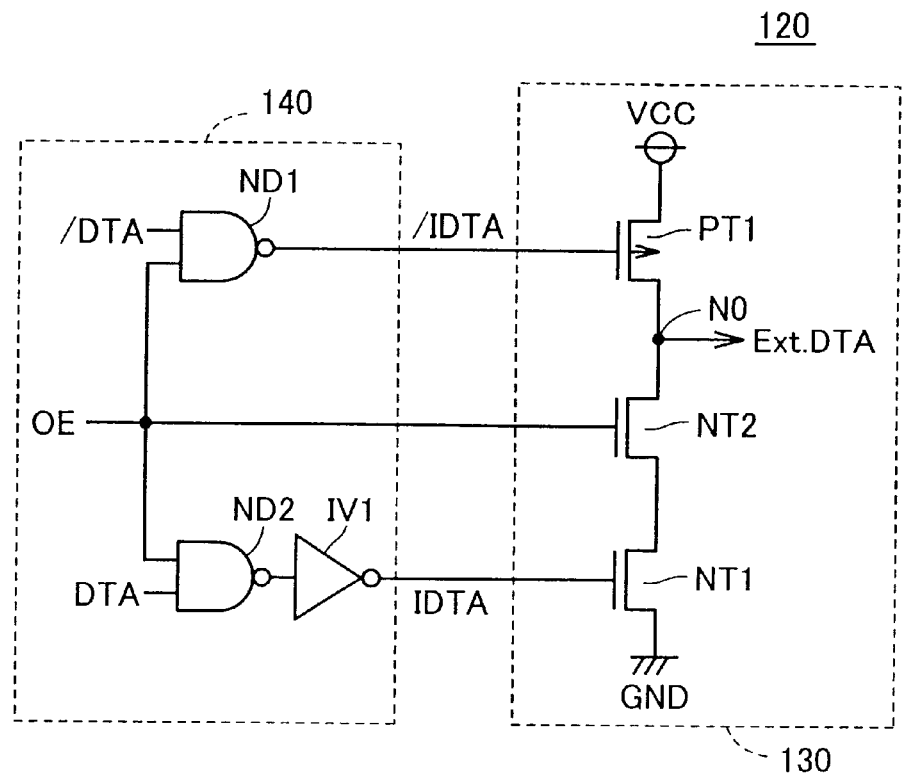
FIG. 2 shows a circuit configuration of an output portion.

With reference to FIG. 2, output portion 120 includes an output buffer circuit 130 and an output control circuit 140. Output buffer circuit 130 outputs external data signal Ext-.DTA in response to a signal of data read from memory array 110 and amplified by sense amplifier 116. Output control circuit 140, provided to control output buffer circuit 130, receives a signal of data DTA, /DTA read from memory array 110 and outputs an internal data signal IDTA, /IDTA and output enable signal OE to output buffer circuit 130.

Output control circuit 140 includes NAND circuits ND1 and ND2 and an inverter IV1.

NAND circuit ND1 receives data signal /DTA and output enable signal OE and outputs an NAND of the signals as internal data signal /IDTA to output buffer circuit 130. NAND circuit ND2 receives data signal /DTA and output enable signal OE and outputs an NAND of the signals to inverter IV1. Inverter IV1 inverts a signal received from NAND circuit ND2 and outputs it as internal data signal IDTA to output buffer circuit 130.

Output buffer circuit 130 includes a p channel MOS transistor PT1 and n channel MOS transistors NT1 and NT2.

P channel MOS transistor PT1 is connected between power supply voltage VCC and node N0 and has its gate receiving internal data signal /IDTA. N channel MOS transistors NT1 and NT2 are connected in series between a ground voltage GND and node N0 and have their respective gates receiving internal data signal IDTA and output enable signal OE, respectively.

Output buffer circuit 130 is enabled when output enable signal OE has the high level, and, with output buffer circuit 130 thus enabled, in response to an internal data signal either one of transistors PT1 and NT1 complementarily turns on to output external data signal Ext. DTA.

When output enable signal OE has the low level, internal data signals IDTA and /IDTA are set low and high, respectively. Thus transistors NT1 and PT1 are turned off and so is transistor NT2. The transistors configuring output buffer circuit 130 are thus all turned off and output buffer circuit 130 is thus disabled.

Figure 3:
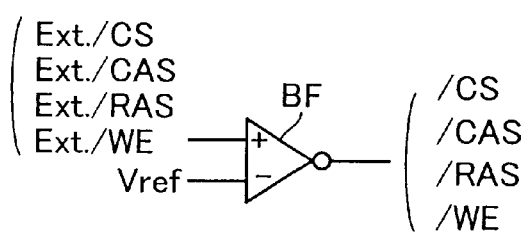
FIG. 3 shows a configuration of a control buffer circuit included in a control signal generation circuit.

With reference to FIG. 3, control signal generation circuit 117 includes a control buffer circuit BF, which receives an external control signal to generate an internal control signal. More specifically, control buffer circuit BF compares external control signals, i.e., external chip select signal Ext./CS, external column address strobe signal Ext./CAS, external row address strobe signal Ext./RAS and external write enable signal Ext./WE with an input signal of a reference voltage level Vref to generate internal control signals or chip select signal /CS, column address strobe signal /CAS, row address strobe signal /RAS and write enable signal /WE.

Figure 4:
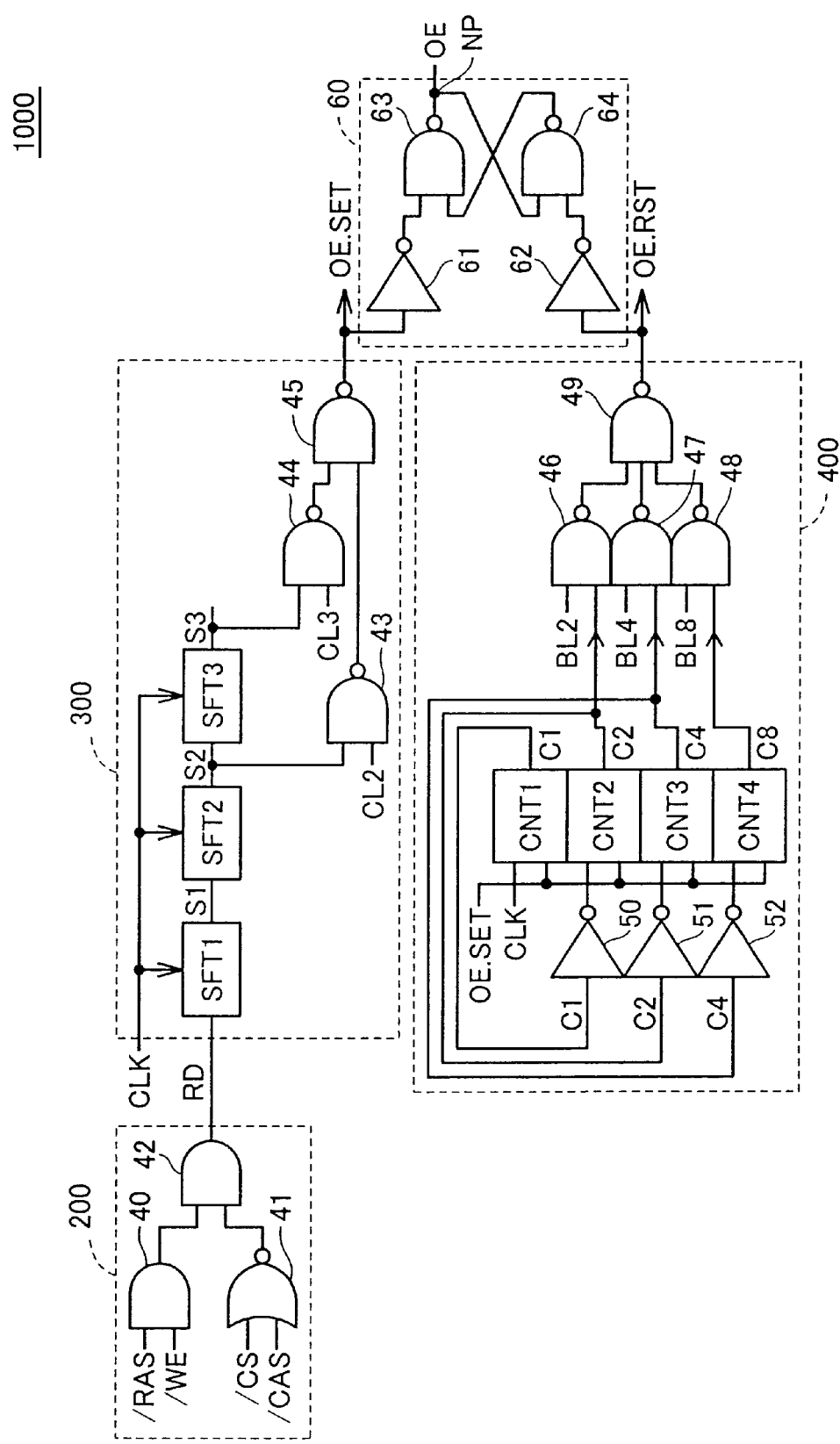
FIG. 4 shows a configuration of an output enable signal generation circuit included in a control signal generation circuit to generate an output enable signal.

FIG. 4 shows an output enable signal generation circuit 1000 included in control signal generation circuit 117 to generate output enable signal OE. Output enable signal generation circuit 100 includes a read command generation circuit 200 generating a read command RD, a latency setting circuit 300 setting a period which starts when read command RD is generated and which ends when data is output, a burst length setting circuit 400 defining a number of data output successively, and an OE setting circuit 60 setting a period during which output enable signal OE is active.

Control signal generation circuit 117 sets as the output enable signal OE active period a period which starts after read command RD is generated when a predetermined number of clock cycles of the clock signal has been counted or a period allowing data to be output elapses and which ends when a predetermined number of clock cycles corresponding to a previously set number of data read has been counted.

Read command generation circuit 200 includes an AND circuit 40 receiving internal control signals or row address strobe signal /RAS and write enable signal /WE to output an AND of the signals, an NOR circuit 41 receiving internal control signals or chip select signal /CS and column address strobe signal /CAS to output an NOR of the signals, and an AND circuit 42 receiving signals output from AND circuit 40 and NOR circuit 41 to output an AND of the signals as read command RD.

When row address strobe signal /RAS and write enable signal /WE both have the high level and chip select signal /CS and column address strobe signal /CAS both have the row level, read command generation circuit 200 generates read command RD and sets it high.

Latency setting circuit 300 includes shift circuits SFT1–SFT3 and NAND circuits 43–45.

Latency setting circuit 300 can set a latency count of two or three. Note that a latency count corresponds to a period which starts when read command RD is input and which ends when outputting data starts. Shift circuits SFT1–SFT3 (hereinafter generally also referred to as a shift circuit SFT) are connected in series and operate in response to clock signal CLK to latch read command RD input and transmit it to a subsequent shift circuit in order.

NAND circuit 43 receives a shift signal S2 output from shift circuit SFT2 and a latency control signal CL2 to output an NAND of the signals to NAND circuit 45. NAND circuit 44 receives a shift signal S3 output from shift circuit SFT3 and a latency control signal CL3 to output an NAND of the signals to NAND circuit 45. NAND circuit 45 receives signals output from NAND circuits 43 and 44 and outputs them as an output start signal OE.SET. Latency control signal CL2 is set high when a latency count or a period which starts when read command RD is input and which ends when effective data is output is set to be two clock cycles. Latency control signal CL3 is set high for a latency count set to be three clock cycles.

Figure 5:
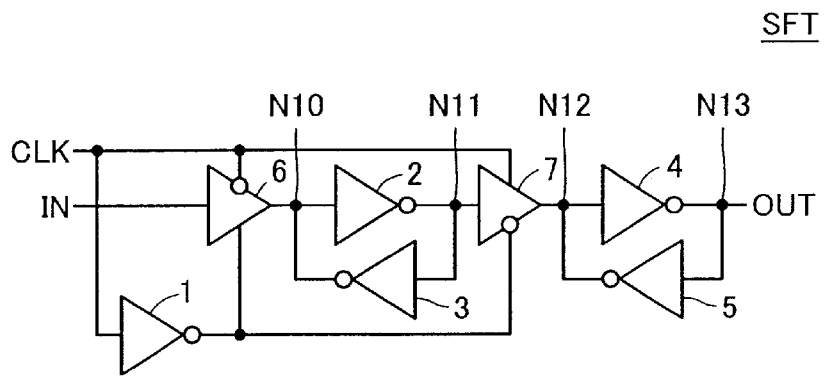
FIG. 5 shows a configuration of a shift circuit.

With reference to FIG. 5, shift circuit SFT includes inverters 1–5 and clocked inverters 6 and 7.

Clocked inverters 6 and 7 complimentarily turn on/off receiving clock signal CLK and a signal inverted by inverter 1. Furthermore, clocked inverter 6 receives an input signal IN and transmits an inverted version thereof to a node N10, and clocked inverter 7 inverts a signal transmitted to a node N11 and transmits it to a node N12. Inverter 2 inverts a signal transmitted to node N10 and transmits it to node N11, and inverter 3 inverts a signal transmitted to node Nil and transmits it to node N10. Inverters 2 and 3 thus form a latch circuit. Inverter 4 inverts a signal transmitted to a node N12 and transmits it to a node N13, and inverter 5 inverts a signal transmitted to node N13 and transmits it to node N12. Inverters 4 and 5 thus together form a latch circuit. Furthermore, shift circuit SFT outputs as an output signal OUT a signal transmitted to node N13.

When clock signal CLK has the low level, shift circuit SFT latches input signal IN at the latch circuit formed by inverters 2 and 3, and when clock signal attains the high level, shift circuit SFT externally outputs the latched input signal IN as output signal OUT.

Referring again to FIG. 4, burst length setting circuit 400 operates in response to burst length control signals BL2, BL4 and BL8 to generate an output end signal OE.RST indicating that outputting data ends. Burst length control signals BL2, BL4 and BL8 set a number of successively output data as 2, 4 and 8, respectively. More specifically, burst length setting circuit 400 sets as a number of clock cycles based on a number of data successively output a period which starts when output start signal OE.SET attains the high level and which ends when output end signal OE.RST is generated. For example, if a burst length or a number of data successively output is two, burst length control signal BL2 is set high and a period which starts when signal OE.SET attains the high level and which ends when signal OE.RST attains the high level is set to be two clock cycles. Similarly; if a burst length of four is set, burst length control signal BL4 is set high and a period which starts when signal OE.SET attains the high level and which ends when signal OE.RST attains the high level is set to be four clock cycles.

Burst length setting circuit 400 includes counter circuits CNT1–CNT4 (hereinafter generally also referred to as a counter circuit CNT), inverters 50–52, and NAND circuits 46–49.

Counter circuit CNT1 receives clock signal CLK and output start signal OE.SET to output a counter signal C1. Counter circuit CNT2 receives counter signal C1 inverted by inverter 50 and signal OE.SET to output a counter signal C2. Counter circuit CNT3 receives counter signal C2 inverted by inverter 51 and signal OE.SET to output a counter signal C4. Counter circuit CNT4 receives counter signal C4 inverted by inverter 52 and signal OE.SET to output a counter signal C8.

NAND circuit 46 receives burst length control signal BL2 and counter signal C2 to output an NAND of the signals to NAND circuit 49. NAND circuit 47 receives burst length control signal BL4 and counter signal C4 to output an NAND of the signals to NAND circuit 49. NAND 48 receives burst length control signal BL8 and counter signal C8 to output an NAND of the signals to NAND circuit 49. NAND circuit 49 receives signals output from NAND circuits 46-48 to output an NAND of the signals as output end signal OE.RST.

Figure 6:
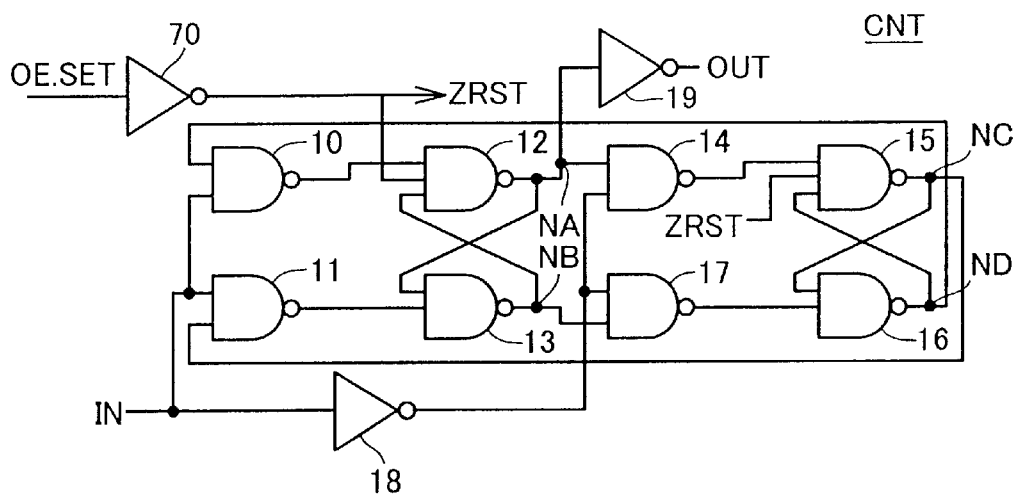
FIG. 6 shows a configuration of a counter circuit.

With reference to FIG. 6, the counter circuit is configured by a so-called T-type flip-flop circuit in two stages connected in series.

Counter circuits CNT1–CNT4 are identically configured and counter circuit CNT receiving input signal IN to output output signal OUT will representatively be described.

Counter circuit CNT includes NAND circuits 10–17, and inverters 18, 19 and 70. Inverter circuit 70 receives output start signal OE.SET to produce an inverted signal ZRST serving as a reset signal. Herein, reset signal ZRST having the low level resets counter circuit CNT and sets a node NA high. Thus, when output start signal OE.SET is set high, counter circuit CNT is reset and output signal OUT is set low. When output start signal OE.SET is set low, reset signal ZRST is set high and counter circuit CNT is activated.

NAND circuits 10–13 form one T-type flip-flop circuit. NAND circuit 11 receives input signal IN and a signal transmitted to a node NC and outputs an NAND of the signals to NAND circuit 13. NAND circuit 13 receives a signal transmitted to node NA and a signal output from NAND circuit 11 and transmits an NAND of the signals to a node NB. NAND circuit 10 receives input signal IN and a signal transmitted to a node ND and outputs a NAND of the signals to NAND circuit 12. NAND circuit 12 receives a signal output from NAND circuit 10, a signal transmitted to node NB and reset signal ZRST and transmits an NAND of the signals to node NA.

NAND circuits 14–17 form the other T-type flip-flop circuit. NAND circuit 14 receives a signal transmitted to node NA and input signal IN inverted by inverter 18 and outputs an NAND of the signals to NAND circuit 15. NAND circuit 17 receives a signal transmitted to node NB and input signal IN inverted by inverter 18 and outputs an NAND of the signals to NAND circuit 16. NAND circuit 16 receives a signal transmitted to node NC and a signal output from NAND circuit 17 and outputs an NAND of the signals to node ND. NAND circuit 15 receives a signal transmitted to node ND, a signal output from NAND circuit 14 and reset signal ZRST and transmits an NAND of the signals to node NC.

Inverter 19 inverts a signal transmitted to node NA and outputs it as output signal OUT.

One T-type flip-flop circuit formed by NAND circuits 10–13 inverts signals of nodes NA and NB in level when input signal IN has the high level. When input signal IN has the low level, signals of nodes NA and NB do not change in level. The other T-type flip-flop circuit formed by NAND circuits 14–16 inverts signals of nodes NC and ND in level when input signal IN has the low level. When input signal IN has the high level, signals of nodes NC and ND do not change in level. In other words, one and the other T-type flip-flop circuits complementarily operate in response to input signal IN to alternately invert signals of nodes NA and NB and those of nodes NC and ND in level.

For example, for counter circuit CNT1 receiving clock signal CLK as input signal IN, when clock signal CLK goes from low to high, for example nodes NA and NB are set high and low, respectively. Subsequently, when clock signal CLK falls from high to low, nodes NC and ND are set low and high, respectively.

Thus, when clock signal CLK subsequently goes from low to high or a single period elapses, node NA and NB are inverted to attain the low and high levels, respectively, in response to signals of the low and high levels set for nodes NC and ND, respectively.

Thus, for counter CNT1, whenever one cycle of clock signal CLK elapses the counter signal C1 data is inverted in level in order. More specifically, counter signal C1 goes from low to high for one clock cycle of clock signal CLK.

As has been described above, counter signal C1 is input to counter circuit CNT2 via inverter 50. As such, for counter circuit CNT2, whenever one period of counter signal C1 elapses the counter signal C2 data is inverted in level in order. Counter signal C2 thus goes from low to high for two clock cycles of clock signal CLK. Similarly for counter circuits CNT3 and CNT4 whenever a one period of counter signals C2 and C4 input elapses the counter signals C4 and C8 data are inverted in level in order. Counter signal C4 thus goes from low to high for four clock cycles of clock signal CLK. Counter signal C8 goes from low to high for eight clock cycles of clock signal CLK.

Referring again to FIG. 4, OE setting circuit 60 includes inverters 61 and 62 and NAND circuits 63 and 64.

NAND circuit 64 receives a signal transmitted to a node NP and output end signal OE.RST inverted by inverter 62 and outputs an NAND of the signals to NAND circuit 63. NAND circuit 63 receives output end signal OE.RST inverted by inverter 61 and a signal output from NAND circuit 64 and outputs an NAND of the signals to node NP. Furthermore, OE setting circuit 60 outputs as output enable signal OE a signal transmitted to node NP.

For example, when signal OE.RST is set high, signal OE is fixed high. Furthermore, when signal OE.RST is set high, signal OE is fixed low.

Reference will now be made to the timing plots of FIG. 7 to describe a data read in accordance with the first embodiment with a latency count of two and a burst length of four set by way of example. More specifically, latency control signal CL2 is set high and burst length control signal BL4 is set high for the sake of illustration.

Figure 7:
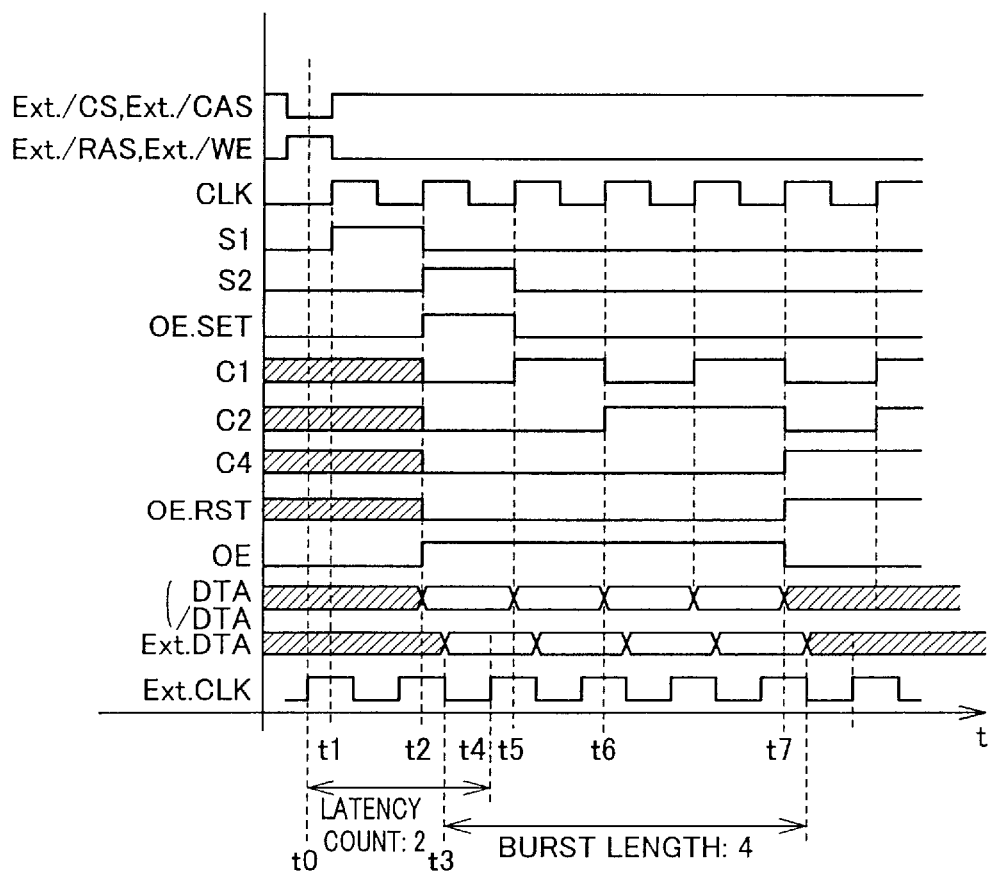
FIG. 7 is timing plots provided when data is read in the first embodiment.

With reference to FIG. 7, before data is read or at time t0 external chip select signal EXT./CS and external column address strobe signal EXT./CAS input in synchronization with external clock signal Ext.CLK to produce read command RD are both set low and external row address strobe signal Ext./RAS and external write enable signal Ext./WE also input in synchronization with external clock signal Ext.CLK to produce read command RD are set high. In response to their input, read command RD is generated and data is in effect read.

Currently clock signal CLK has the low level and shift circuit SFT1 thus latches a signal of the high level. Then when clock signal CLK attains the high level or at time t1 the high level latched by shift circuit SFT1, or shift signal S1, is output. Then at time t2 shift circuit SFT2 outputs as shift signal S2 a signal of the high level latched, receiving shift signal S1 input.

At time t2 shift signal S2 goes high and in response output start signal OE.SET is set high based on latency control signal CL2 (of the high level). In response to signal OE.SET going high, OE setting circuit 60 sets output enable signal OE high.

In response, signal DTA, /DTA of data read from the memory array is output to output buffer circuit 130. Depending on the data signal, output buffer circuit 130 outputs external data signal Ext.DTA at node N0. Because of a delay associating an operation of output buffer circuit 130, at time t2 plus a predetermined period of time, i.e., at time t3, outputting the data starts. The initial effective data is read at time t4, two clock cycles after time t0, at which read command RD is produced. In other words, a latency count of two is provided.

Subsequently when output start signal OE.SET set low or at time t5 counter circuit CNT1 is activated. At time t5 clock signal CLK goes from low to high. Counter circuit CNT1 thus drives counter signal C1 from low to high. A counter signal is input to a subsequent counter circuit in order and at time t6 counter signal C2 goes high. Furthermore at time t7 counter signal C4 goes high. Since burst length control signal BL4 is set high, at time t7 output end signal OE.RST is set high. In response, OE setting circuit 60 sets output enable signal OE low.

Counter signal C4 has the low level at time t2 and attains the high level at time t6. This period from time t2 through t6 corresponds to four clock cycles of clock signal CLK, as has been described above, and four data signals are thus successively read from the memory array in synchronization with clock signal CLK going high. Furthermore, in response to this, output buffer circuit 130 outputs four data signals as external data signal Ext. DTA.

Thus in the first embodiment at output buffer circuit 130 only while a data read is effected output enable signal OE can be activated (or set high) and otherwise inactivated (or set low).

More specifically at output buffer circuit 130 transistor NT2 constantly turned on can be turned only when data is read, and data can thus be read.

Thus, if data is rapidly transferred, when the data read starts the load capacitance on node N0, with transistor NT2 turned on only when data is read, is smaller than it is with transistor NT2 constantly turned on.

Thus in accordance with the present invention for example in a transitional stage in which node N0 has a level in voltage changing from low to high a charging time taken for node N0 to reach a predetermined level in voltage can be reduced.

In other words, the present configuration can reduce a node N0 charging/discharging time depending on data to be transferred and if data is rapidly transferred a desired signal level can sufficiently be ensured in a short period of time and steady, rapid data transfer can thus be achieved.

Second Embodiment

In the first embodiment at output buffer circuit 130 input internal data signals IDTA and /IDTA are input to transistors NT1 and PT1 substantially at the same timing as output enable signal OE is input to activate transistor NT2.

If before transistor NT2 turns on for example transistor PT1 turns on, then a high voltage is applied to transistor NT2 between the source and the drain and, as has been described previously, hot carriers are injected and the transistor's characteristics can disadvantageously be impaired.

On the contrary, if before transistor PT1 turns off transistor NT2 turns on, then a high voltage is too applied to transistor NT2 between the source and the drain and similarly the transistor's characteristics can disadvantageously be impaired.

Accordingly the first embodiment in a variation contemplates that transistor NT2 is turned on before a data read starts and transistor NT2 is turned off after the data read is completed, so that transistor NT2 can be free of impaired device characteristics to achieve steady, rapid data transfer.

Figure 8:
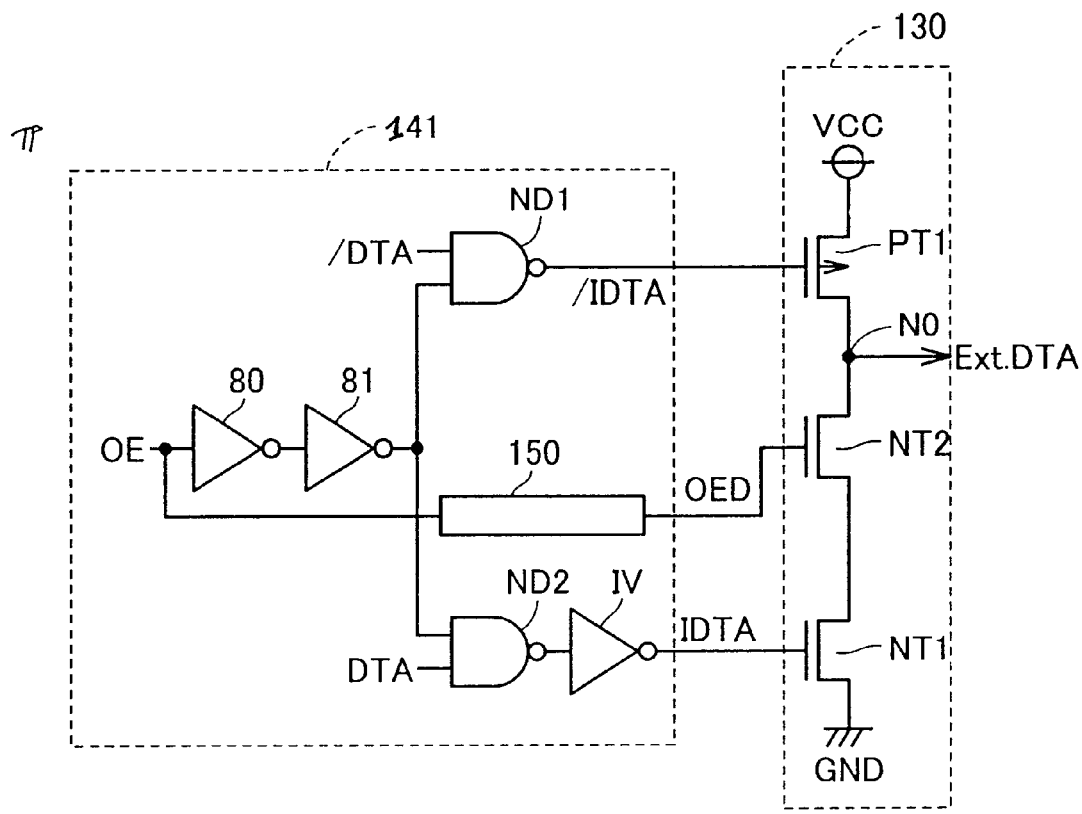
FIG. 8 shows a configuration of an output portion in accordance with a second embodiment of the present invention.

With reference to FIG. 8, in the second embodiment an output portion 121 includes an output buffer circuit 130 and an output control circuit 141. Output portion 121 is different from output portion 120 of the first embodiment shown in FIG. 2 in that output control circuit 140 is replaced by output control circuit 141 and that output buffer circuit 130 includes transistor NT2 receiving a delay output enable signal OED at its gate.

Output control circuit 141 is different from output control circuit 140 in that the former further includes inverters 80 and 81 and a delay adjustment circuit 150 adjusting a timing of output enable signal OE.

Inverters 80 and 81 are connected in series to form a delay stage providing a delay by a period Δtd1 and NAND circuits ND1 and ND2 both receive output enable signal OE having passed through a single delay stage.

Figure 9:
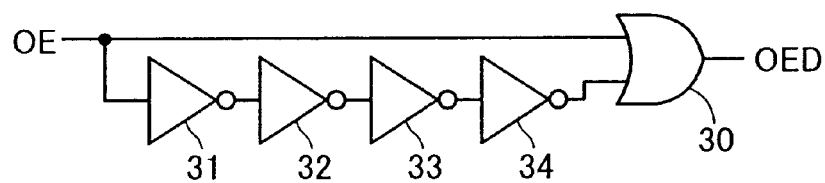
FIG. 9 shows a configuration of a delay adjustment circuit.

With reference to FIG. 9, delay adjustment circuit 150 includes an OR circuit 30 and inverters 31–34. OR circuit 30 receives output enable signal OE and output enable signal OE passing through two delay stages formed by inverters 31–34 and outputs an OR of the signals as delay output enable signal OED. Signal OED rises at the same timing that signal OE input does, and signal OED falls later by a delay time period Δtd2 attributed to the passage through the two delay stages.

Figure 10:
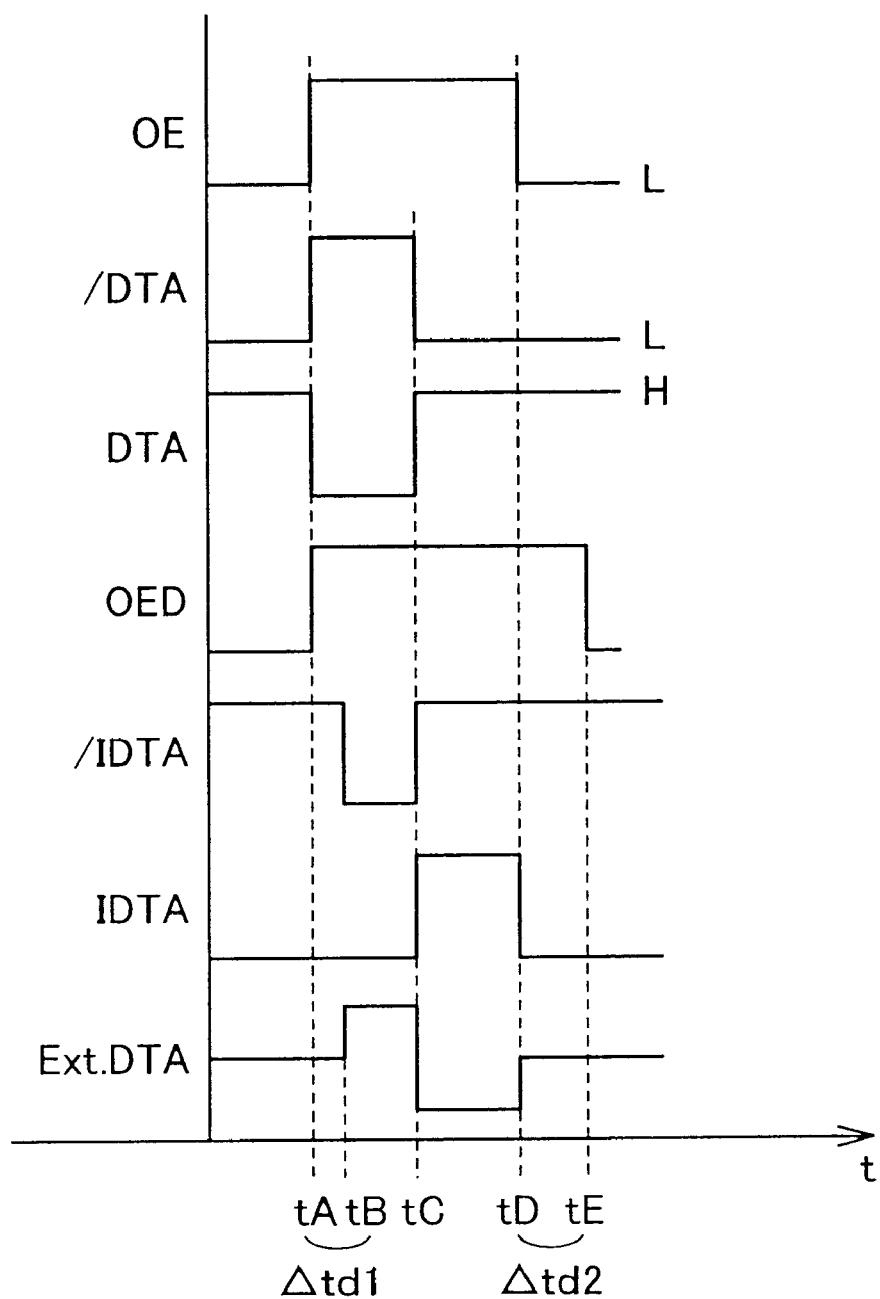
FIG. 10 is timing plots in a data read in an output portion in accordance with the second embodiment.

Reference will now be made to FIG. 10 to consider two data signals being output. First data signals DTA and /DTA are low and high, respectively, and second data signals DTA and /DTA are high and low, respectively, for the sake of illustration.

At time tA output enable signal OE has the high level and the first data signal DTA, /DTA is input for the sake of illustration. At time tA delay output enable signal OED is set high. Transistor NT2 thus turns on, when internal data signals IDTA and /IDTA are set low and high, respectively, as the delay stage formed by inverters 80 and 81 delays signal OE by period Δtd1, and transistors NT1 and PT1 are both turned off. Internal data signal /IDTA is set low at time tA plus period Δtd1, i.e., at time tB and external data signal Ext.DTA is set high.

Then at time tC signal OE has the high level. If the second data signal DTA and /DTA are input, internal data signal IDTA is set high and external data signal Ext.DTA is set low. When signal OE attains the low level, or at time tD, outputting external data signal Ext.DTA completes and internal data signals IDTA and /IDTA are set low and high, respectively. Transistors NT1 and PT1 thus turn off. Transistor NT2 is turned on as signal OED rises later than signal OE, and the transistor turns off at time tD plus period Δtd2, i.e., at time tE.

In accordance with the second embodiment output portion 121 is so configured that before a data read starts transistor NT2 can be turned on and after the data read ends transistor NT2 can be turned off to prevent transistor NT2 experiencing between the source and drain a high voltage which in turn contributes to injection of hot carriers impairing the transistor's device characteristics. Steady, rapid data transfer can thus be achieved.

Third Embodiment

Figure 11:
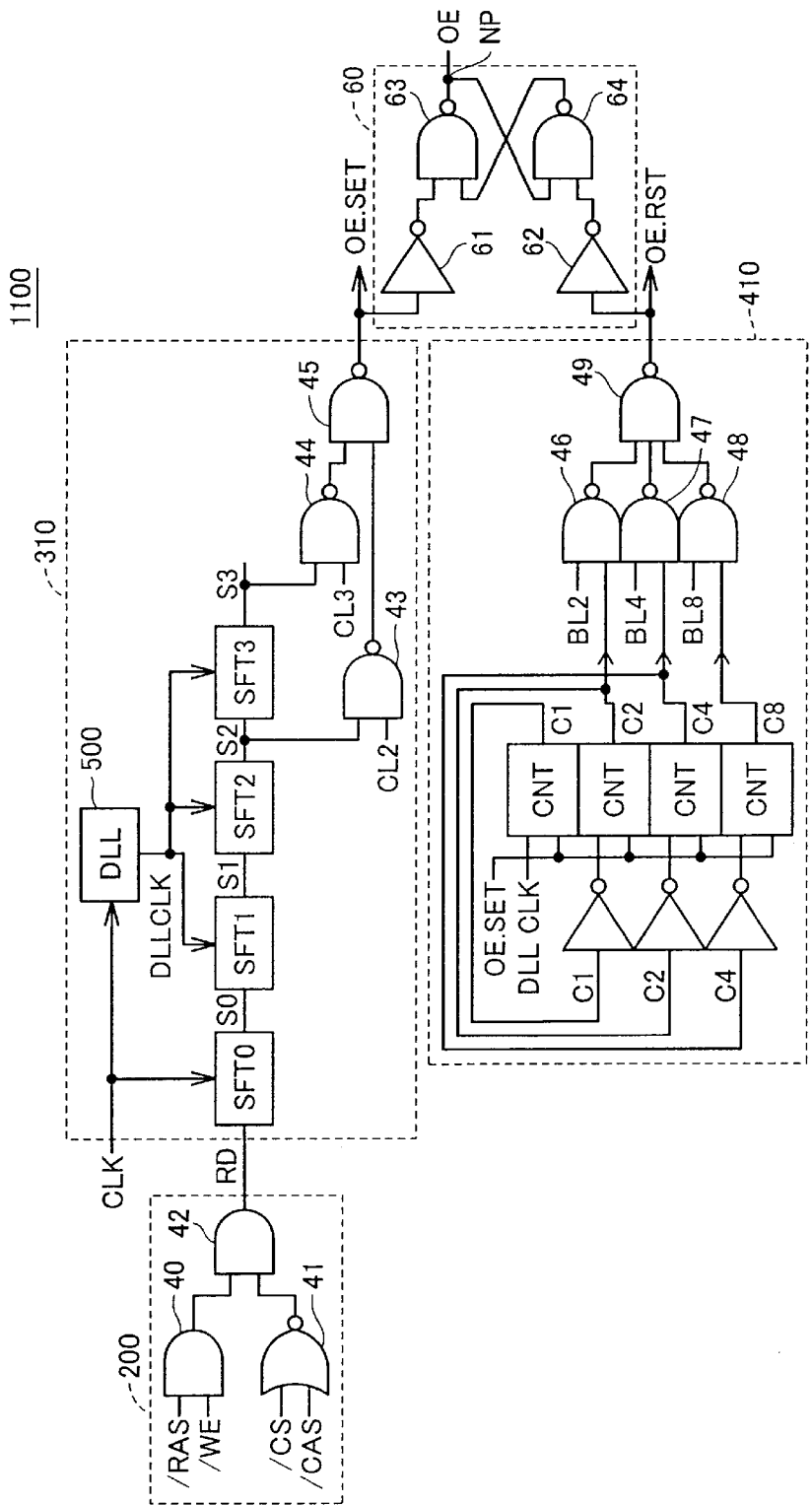
FIG. 11 shows a configuration of an output enable signal generation circuit in accordance with a third embodiment of the present invention.

With reference to FIG. 11, an output enable signal generation circuit 1100 of a third embodiment is similar to the FIG. 4 output enable signal generation circuit 1000 except that latency setting circuit 300 is replaced by a latency setting circuit 310 and that burst length setting circuit 400 is replaced by a burst length setting circuit 410.

Circuit 310 differs from circuit 300 in that the former further includes a shift circuit SFT0 and a delay locked loop (DLL) circuit 500 synchronized with clock signal CLK to generate a clock signal DLLCLK corresponding to clock signal CLK delayed by a predetermined phase. Clock signal DLLCLK corresponding to clock signal CLK having its phase adjusted can be used to adjust a timing of a clock and hence that of outputting data.

Shift circuit SFT0 receives read command RD and operates in response to clock signal CLK to output shift signal S0 to shift circuit SFT1. Shift circuits SFT1–SFT3 output shift signals S1–S3 in response to clock signal DLLCLK input. The remainder is similar as described above.

Burst length setting circuit 410 is different only in that clock signal CLK input is replaced with clock signal DLLCLK.

Figure 12:
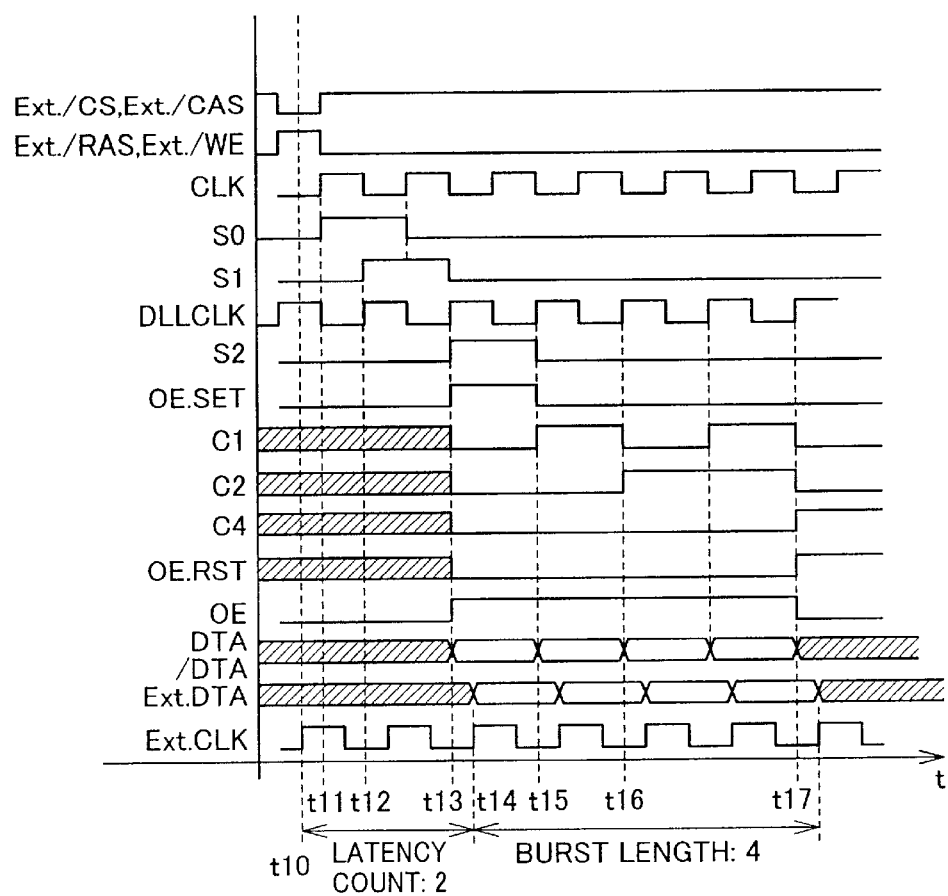
FIG. 12 is timing plots provided when data is read in the third embodiment.

Reference will now be made to FIG. 12 to describe that data is read in the third embodiment with a latency count of two and a burst length of four set by way of example. In other words, latency control signal CL2 is set high and burst length control signal BL4 is set high for the sake of illustration. Furthermore in the present embodiment clock signal DLLCLK is adjusted to be a signal delayed as compared with clock signal CLK by a predetermined phase.

With reference to FIG. 12, when external chip select signal Ext./CS, and external column address strobe signal Ext./CAS are both set low and external row address strobe signal Ext./RAS and external write enable signal Ext./WE are set high, or at time t10, read command RD is produced and data is read. At that time, clock signal CLK has the low level and shift circuit SFT0 thus latches a signal of the high level. Then when clock signal CLK attains the high level or at time ti 1 the high level latched by shift circuit SFT0, or shift signal S0, is output.

Then when clock signal DLLCLK goes from low to high or at time t12 shift circuit SFT1 outputs as shift signal S1 a signal of the high level having been latched, receiving shift signal S0.

Then at time T13 shift circuit SFT2 outputs as shift signal S2 a signal of the high level having been latched, receiving shift signal S1 input.

At time t13, in response to shift signal S2 going high, output start signal OE.SET is set high based on latency control signal CL2 (of the high level). In response to signal OE.SET going high, OE setting circuit 60 sets output enable signal OE high. In response, signal DTA, /DTA of data read from the memory array is output to output buffer circuit 130. In response to the data signal, output buffer circuit 130 outputs external data signal Ext. DTA at time t14 at node N0. Because of a delay associating an operation of output buffer circuit 130, outputting data starts at time t13 plus a predetermined period of time, i.e., at time t14.

Initial effective data is read at time t14, which is two clock cycles after time t10, at which read command RD is produced. The latency count is thus two. At time t14 a timing at which external clock signal Ext.CLK rises and that at which outputting data starts are set to be the same. In the first embodiment, the former timing and the latter timing do not match due to a delay of a time involved in outputting data. More specifically, when clock control circuit 113 produces internal clock signal CLK synchronized with external clock signal Ext.CLK, there is introduced a clock delay corresponding to a period of time t10 through t11. Furthermore, when data is externally output in response to read data, there is also introduced a delay in operation corresponding to a period of time t13 through t14 depending on an internal operation of the output buffer circuit. Because of these delays, a timing at which external clock signal Ext.CLK rises and that at which outputting data starts do not match in externally outputting data. In the present embodiment, a phase difference between clock signal CLK and clock signal DLLCLK generated by DLL circuit 500 can be adjusted to correct the offset in delay.

More specifically, the phase difference is set, considering a period required for an operation of an internal circuit that starts when external clock signal Ext.CLK rises, which corresponds to a timing of starting a data outputting period, and that ends when read data is in effect output to an output node.

Subsequently when output start signal OE.SET is set low or at time t15 counter circuit CNT1 is activated. More specifically at time t15 clock signal DLLCLK goes from low to high. Counter circuit CNT1 thus sets counter signal C1 from low to high. A counter signal is input to a subsequent counter circuit in order and at time t16 counter signal C2 goes high. Furthermore at time t17 counter signal C4 goes high. Since burst length control signal BL4 is set high, at time t17 output end signal OE.RST is set high. In response, OE setting circuit 60 sets output enable signal OE low.

Counter signal C4 has the low level at time t13 and attains the high level at time t17. This period from time t13 through t17 corresponds to four clock cycles of clock signal DLLCLK, as has been described above, and four data signals are thus successively read from the memory array in synchronization with clock signal DLLCLK rising. Furthermore, in response, output buffer circuit 130 outputs four data signals as external data signal Ext. DTA.

The third embodiment can generally resolve a clock delay including clock signal CLK distribution delay. More specifically, data can be read with precision at a timing as intended in designing to allow DLL circuit 500 to generate clock signal DLLCLK synchronized with clock signal CLK at a timing as designed. Furthermore, in FIG. 12, as compared to FIG. 7 providing time plots in the first embodiment, a timing at which external clock signal Ext.CLK rises and that at which outputting external data signal Ext.DTA starts can be matched to enhance the synchronous semiconductor memory device in controllability.

Fourth Embodiment

In the above embodiment is described a configuration based on an SDRAM outputting a data signal in response to clock signal CLK rising.

In contrast, a DDR-SDRAM, although designed to be synchronized with a clock signal higher in frequency than for the SDRAM, can similarly be applied for example in circuit configuration. Because of the clock frequency difference the DDR-SDRAM uses a power supply voltage set to be lower than the SDRAM. For example, as a specification for the SDRAM a power supply voltage of 3.3V is used and for the DDR-SDRAM a power supply voltage of 1.8V is generally used. As such, if the DDR-SDRAM is designed, it operates on a low power supply voltage and the above described output buffer circuit hardly suffers poor device characteristics of a transistor attributed to injection of hot carriers. Thus the DDR-SDRAM operating in synchronization with a fast clock signal can also be configured with a non-NOEMI output buffer circuit with an output terminal experiencing small load capacitance.

In the fourth embodiment will be described a device having an output buffer circuit readily changeable in design when either one of an SDRAM and a DDR-SDRAM is designed.

Figure 13:
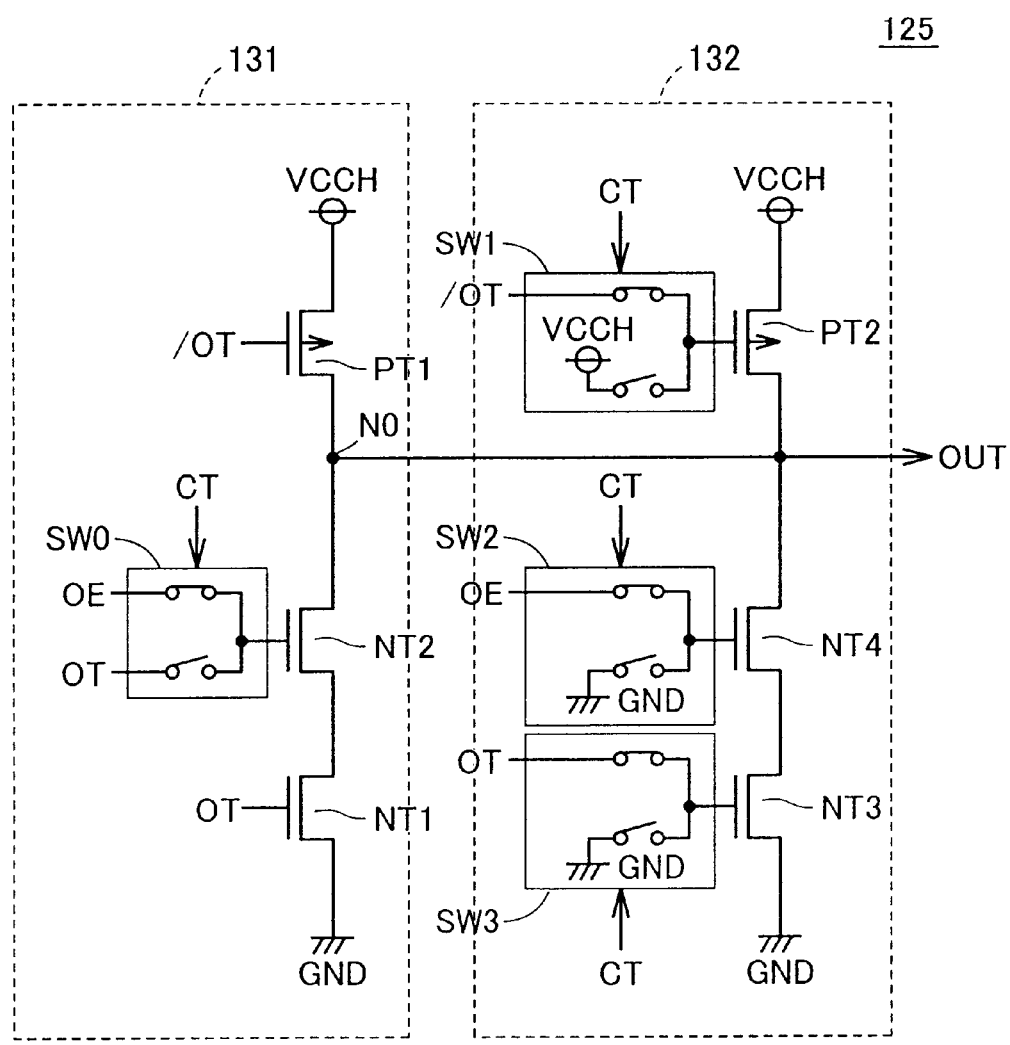
FIG. 13 shows a configuration of an output buffer circuit in accordance with a fourth embodiment of the present invention.

Reference will now be made to FIG. 13 to describe a case with a high power supply voltage VCCH used as an operating voltage.

An output buffer circuit 125 includes output buffer units 131 and 132 provided in parallel. Output buffer unit 131 has a switch circuit SW0, a p channel MOS transistor PT1, and n channel MOS transistors NT1 and NT2.

Transistor PT1 is arranged between power supply voltage VCCH and node N0 and has its gate receiving a data signal /OT. Transistors NT1 and NT2 are arranged in series between node N0 and ground voltage GND and have their respective gates receiving a data signal OT and a signal output from switch circuit SW0. Switch circuit SW0 operates in response to a select signal CT to switch one of output enable signal OE and data signal OE for output.

Output buffer unit 132 has switch circuits SW1–SW3, a p channel MOS transistor PT2, and n channel MOS transistors NT3 and NT4.

Transistor PT2 is arranged between power supply voltage VCCH and node N0 and has its gate receiving a signal output from switch circuit SW1. Switch circuit SW1 operates in response to select signal CT to switch one of data signal /OT and a signal of the high level of power supply voltage VCCH for output. Transistors NT3 and NT4 are arranged in series between node N0 and ground voltage GND and have their respective gates receiving signals output from switch circuits SW3 and SW2. Switch circuit SW3 operates in response to select signal CT to switch one of data signal OT and a signal of the low level of ground voltage GND for output. Switch circuit SW2 operates in response to select signal CT to switch one of output enable signal OE and a signal of the low level of ground voltage GND for output.

For example if select signal CT has the high level, switch circuit SW0 switches to output enable signal OE for output. Furthermore switch circuit SW1 switches to data signal /OT for output. Switch circuit SW2 switches to data signal OT for output. Switch circuit SW3 switches to output enable signal OE for output.

In contrast, if select signal CT has the low level then switch circuit SW0 switches to data signal OT for output.

Furthermore switch circuit SW1 switches to power supply voltage VCCH and outputs a signal of the high level, switch circuit SW2 switches to ground voltage GND and outputs a signal of the low level, and switch circuit SW3 switches to ground voltage GND and outputs a signal of the low level.

Herein, if a SDRAM is designed, select signal CT is set high.

This allows output buffer unit 131 to have a configuration of a so-called NOEMI output buffer unit with transistor NT2 operating receiving output enable signal OE and in response to data signal OT, /OT input to set a level in voltage of node N0, and output buffer unit 132 to have a configuration of a so-called NOEMI output buffer unit receiving an input similar to that of output buffer unit 131 and operating in response to data signal OT, /OT to set a level in voltage of node N0.

Figure 14:
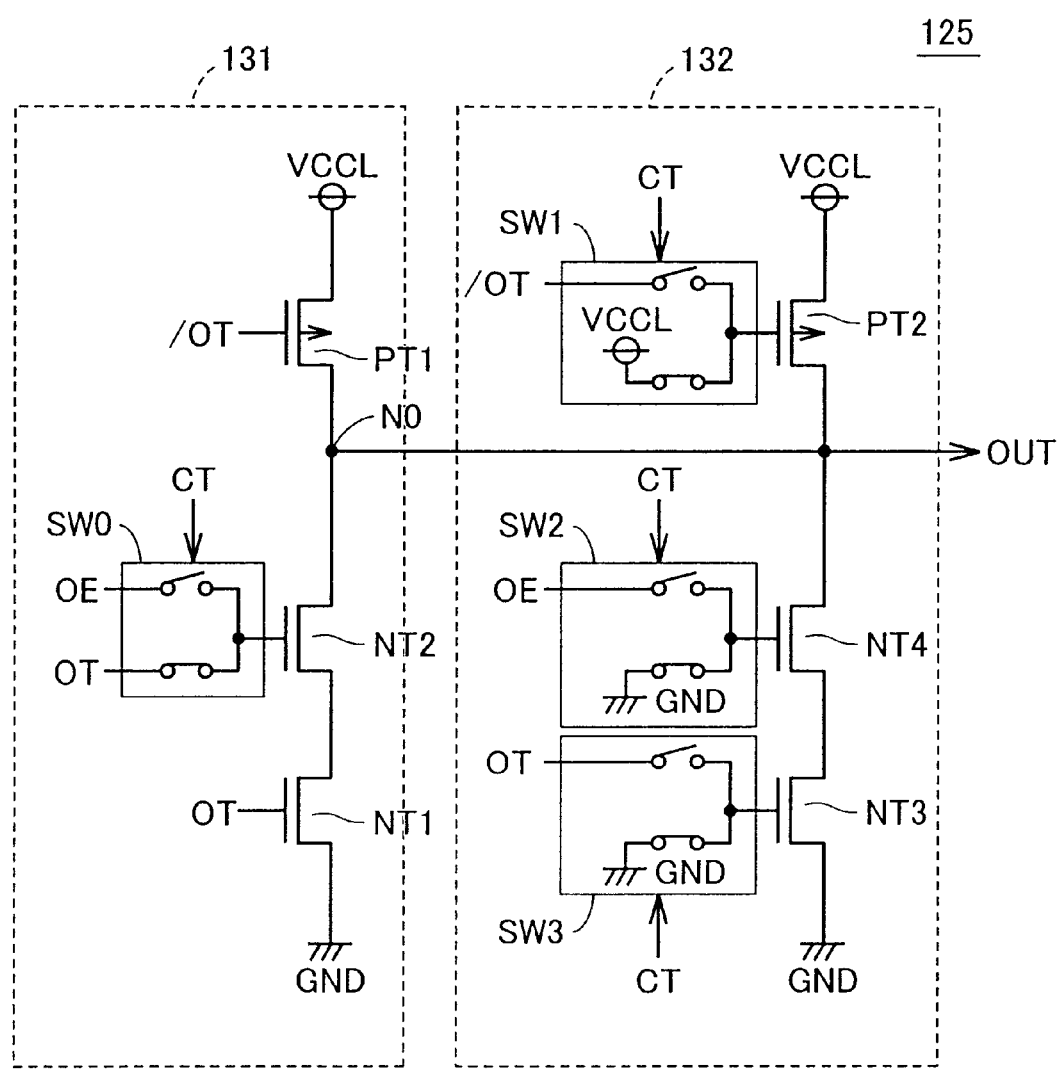
FIG. 14 shows a configuration of the output buffer circuit of the fourth embodiment with a DDR-SDRAM applied thereto.
Figure 15:
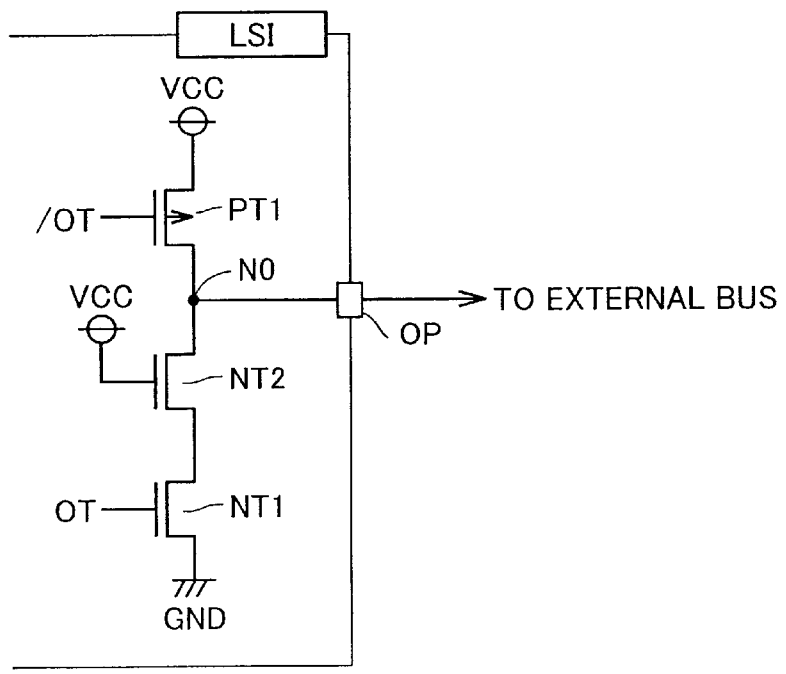
FIG. 15 shows one example of an NOEMI output buffer circuit internal to an LSI.
Figure 16:
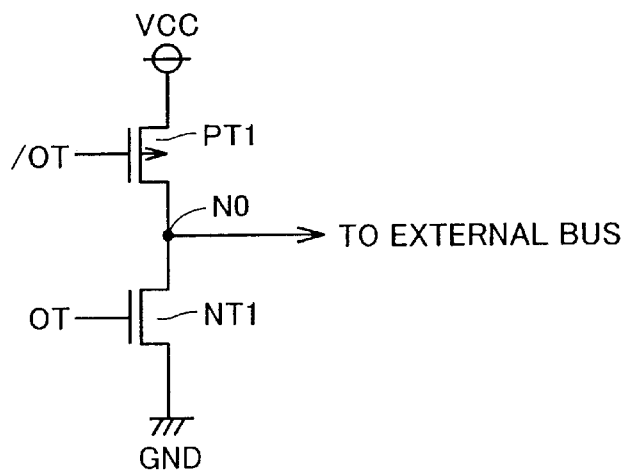
FIG. 16 shows a configuration of a non-NOEMI output buffer circuit.
Figure 17:
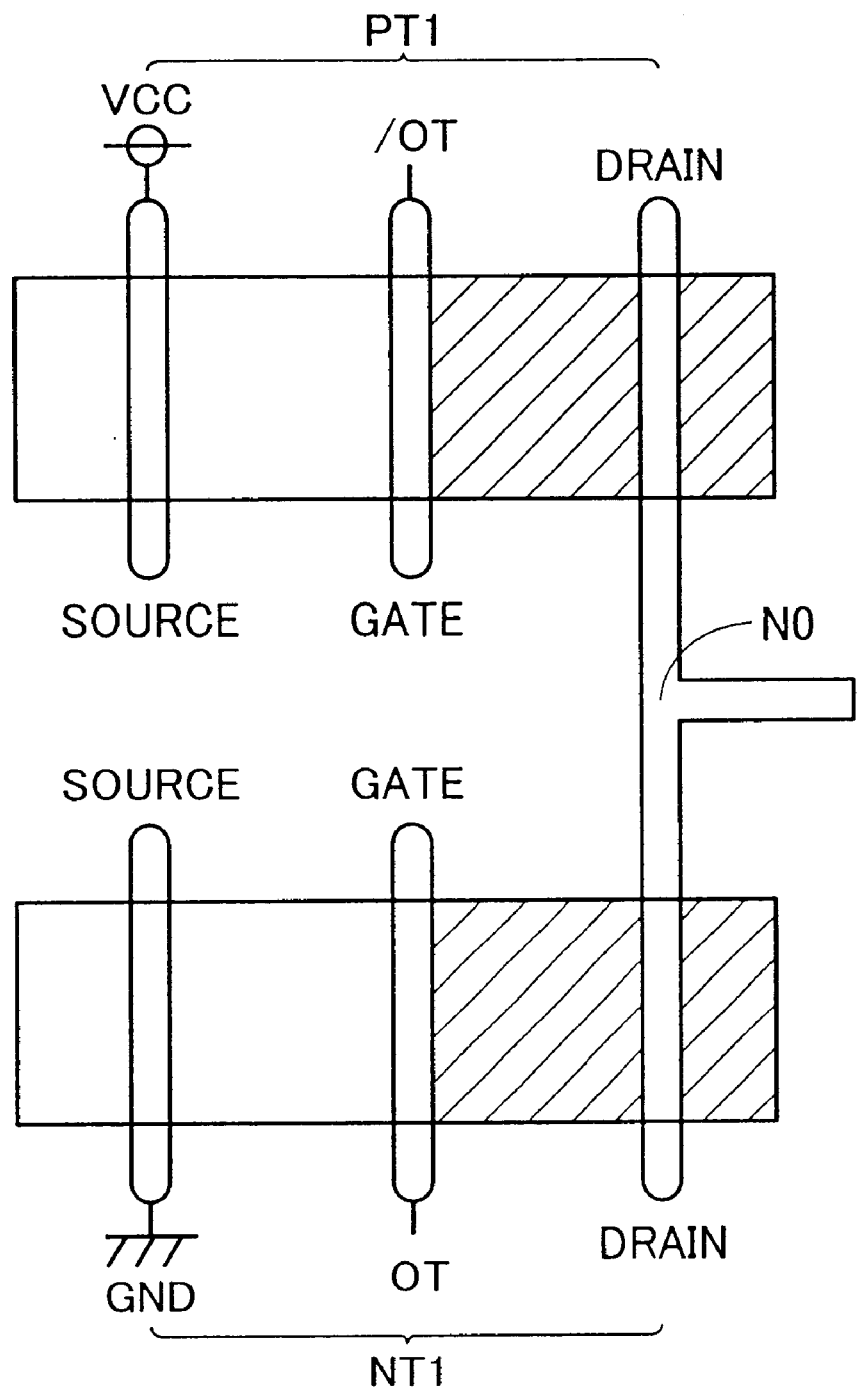
FIG. 17 conceptually shows a region of a load capacitance of an output node N0 for the non-NOEMI output buffer circuit of FIG. 16.
Figure 18:
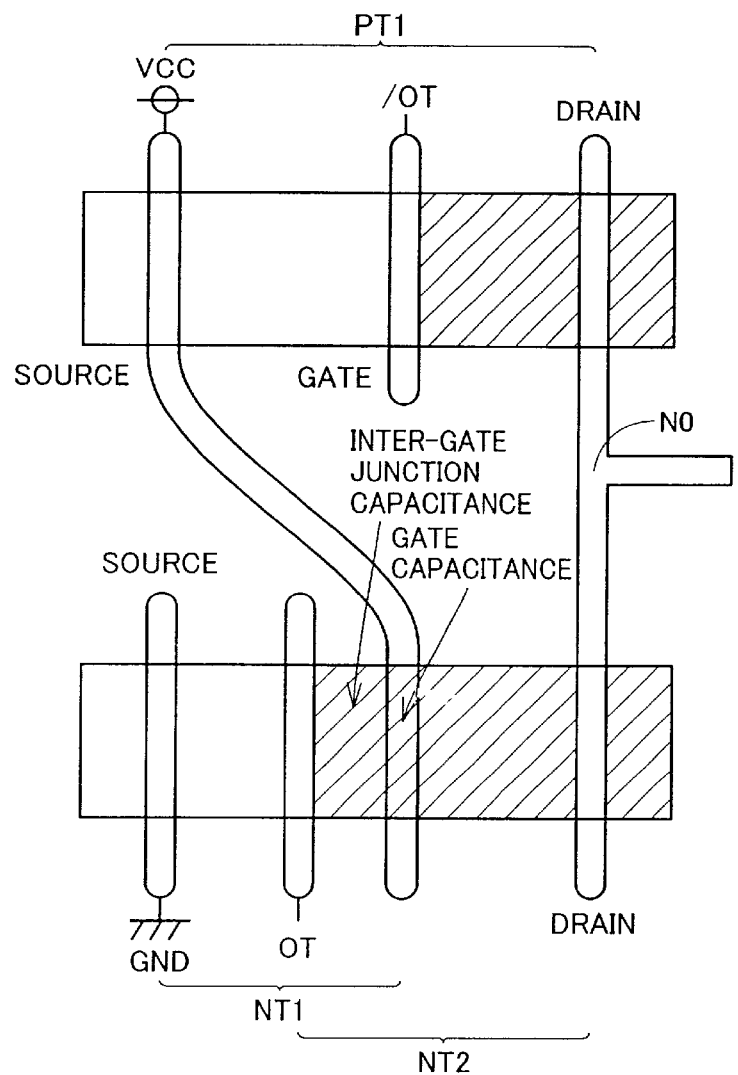
FIG. 18 conceptually shows a region of a load capacitance of output node N0 for the NOEMI output buffer circuit of FIG. 15.
Figure 19:
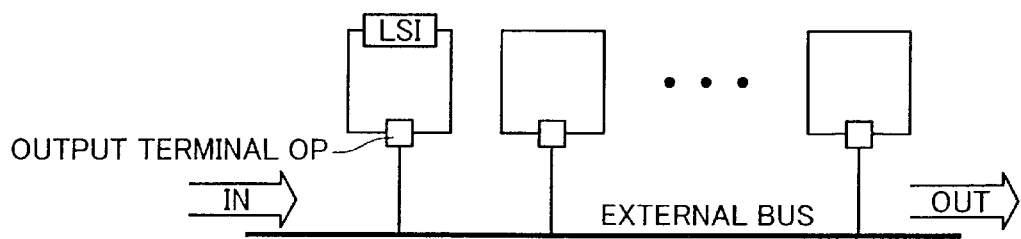
FIG. 19 shows a concept for implementing rapid data transfer in a memory system having a high speed interface.
Figure 20:
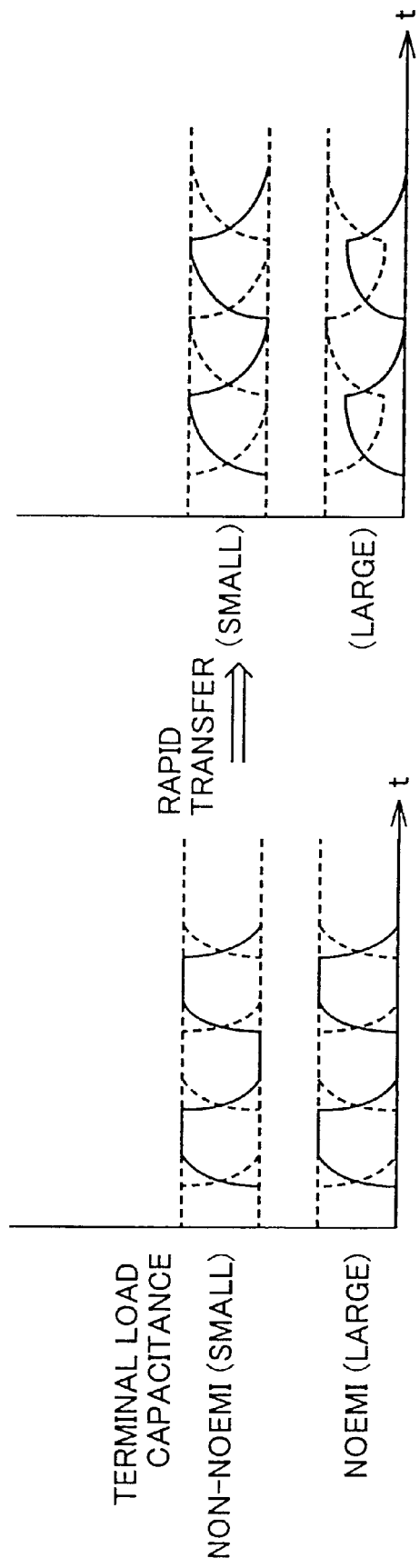
FIG. 20 compares data waveforms based on a difference between load capacitances when data is rapidly transferred.

The FIG. 14 output buffer circuit is similar to the FIG. 13 output buffer circuit except that the former operates on a power supply voltage VCCL lower than power supply voltage VCCH. For a DDR-SDRAM, select signal CT is set low.

This allows switch circuit SW0 to pass data signal OT to the gate of transistor NT2 and transistors NT1 and NT2 turn on/off at the same timing. Output buffer unit 131 thus has a configuration of a non-NOEMI output buffer unit. Furthermore, switch circuit SW1 outputs a signal of the high level of power supply voltage VCCL to the gate of transistor NT2 and transistor PT2 turns off. Furthermore, switch circuits SW2 and SW3 both output a signal of the low level of ground voltage GND to the gates of transistors NT4 and NT3, respectively, and transistors NT3 and NT4 turn off. Output buffer unit 132 is thus electrically disconnected from node N0. Thus in output buffer circuit 125 the 1-stage output buffer unit 131 set as non-NOEMI alone operates to output data.

If the output buffer circuit of the fourth embodiment is incorporated into a device and an SDRAM operating on high power supply voltage VCCH is adopted it can be configured with an output buffer unit of NOEMI provided in two stages in parallel, and if a DDR-SDRAM operating on low power supply voltage VCCL is adopted it can be changed to have a configuration of an output buffer unit of non-NOEMI provided in a single stage.

In other words, if a SDRAM operating on a high power supply voltage is designed its output buffer circuit is configured to be of so-called NOEMI and if a DDR-SDRAM operating on a low power supply voltage is designed then its output buffer circuit is configured to be of so-called non-NOEMI.

In accordance with the fourth embodiment a design of an output buffer can be generalized between a DDR-DRAM and a SDRAM operating on different levels of voltage.

Furthermore the DDR-DRAM operating on low power supply voltage that employs a non-NOEMI output buffer circuit can reduce a capacitance serving as a load imposed on an output terminal and thus transfer data rapidly with high precision.

Note that in place of the DDR-DRAM a DDR2-SDRAM operated in synchronization with a clock faster than that for the DDR-DRAM can also be designed. Note that the DDR2-SDRAM operates on a voltage of 1.8V, which is adopted as a specification thereof.

Furthermore if the DDR-DRAM and the DDR2-SDRAM are designed within a single chip, the above described output buffer circuit 125 can be used to configure the DDR-DRAM's output buffer circuit to be of NOEMI and the DDR2-SDRAM's output buffer circuit to be of non-NOEMI.

Although the present invention has been described and illustrated in detail, it is clearly understood that the same is by way of illustration and example only and is not to be taken by way of Limitation, the spirit and scope of the present invention being limited only by the terms of the appended claims.

What is claimed is:

1. A synchronous semiconductor memory device operating in synchronization with a clock signal, comprising, a memory array having a plurality of memory cells arranged in rows and columns and each storing data;

a control signal generation circuit receiving an external instruction input in synchronization with said clock signal to generate a control signal for defining a data output period in response to said external instruction;

an output buffer receiving data read from said memory array for output to an output node during said data output period, said output buffer circuit including a first transistor connected between said output node and a first voltage, a second transistor connected between said output node and a second voltage, and a third transistor connected between said output node and said second voltage in series with said second transistor; and an output control circuit controlling turning on/off said first, second and third transistors, said output control circuit in said data output period complementarily turning on and off one of said first and second transistors in response to said read data and also turning on said third transistor in response to said control signal.

2. The synchronous semiconductor memory device according to claim 1, wherein said control signal generation circuit starts generating said control signal after said external instruction is input when a first predetermined first number of clock cycles of said clock signal has elapsed, and said control signal generation circuit thereafter continues to generate said control signal until a second predetermined number of clock cycles elapses, said second predetermined number of clock cycles corresponding to a previously set number of said read data.

3. The synchronous semiconductor memory device according to claim 1, wherein said output control circuit in outputting said read data turns on said third transistor earlier than said first and second transistors and turns off said third transistor later than said first and second transistors.

4. The synchronous semiconductor memory device according to claim 1, further comprising a phase synchronization circuit generating an adjustment clock signal synchronized with said clock signal and having a predetermined phase difference from said clock signal, wherein:

said control signal generation circuit generates said control signal in synchronization with said adjustment clock signal; and setting said predetermined phase difference depends on a period required for an operation internal to said synchronous semiconductor memory device, said period required starting at a timing of activation of said clock signal corresponding to a timing of starting said data output period, said period required ending when said read data is in effect output to said output node.

5. A synchronous semiconductor memory device operating in synchronization with a clock signal on one of a first voltage and a second voltage higher than said first voltage and, comprising:

a memory array having a plurality of memory cells arranged in rows and columns and each storing data;

a control signal generation circuit receiving an external instruction input in synchronization with said clock signal to generate a control signal for defining a data output period in response to said external instruction;

an output buffer receiving data read from said memory array for output to an output node during said data output period, said output buffer circuit including a first transistor connected between said output node and a first power supply node, a second transistor connected between said output node and a second power supply node, and a third transistor connected between said output node and said second power supply node in series with said second transistor; and an output control circuit controlling turning on/off said first, second and third transistors, said output control circuit in said data output period complementarily turning on and off one of said first and second transistors in response to said read data and also turning on said third transistor in response to said control signal when said first power supply node is connected to said second voltage and said second power supply node is also connected to a third voltage lower than said first and second voltages, said output control circuit in said data output period complementarily turning on and off one of said first transistor and both of said second and third transistors in response to said read data when said first power supply node is connected to said first voltage and said second power supply node is also connected to said third voltage.

* * * * *